United States Patent [19]
Rahhal

[11] Patent Number: 4,975,685
[45] Date of Patent: Dec. 4, 1990

[54] GUIDE PATH SHORT DETECTOR

[75] Inventor: Rodger G. Rahhal, Canton, Mich.

[73] Assignee: General Motors Corporation, Detroit, Mich.

[21] Appl. No.: 348,750

[22] Filed: May 8, 1989

[51] Int. Cl.⁵ ............................................. G08B 21/00
[52] U.S. Cl. .................... 340/651; 324/556; 364/424.02
[58] Field of Search ................. 340/651, 652; 364/424.01, 424.02, 478; 180/167-169; 246/28 F, 28 C, 28 E, 28 H, 28 K, 34 C, 34 CT, 41, 50, 58, 28 R; 324/508, 522, 525, 539, 541, 542, 555, 556

[56] References Cited

U.S. PATENT DOCUMENTS

| | | | |
|---|---|---|---|
| 1,255,668 | 2/1918 | Thurber | 246/34 C |
| 3,639,810 | 2/1972 | Schleif | 307/152 |
| 3,669,207 | 6/1972 | Fellgett et al. | 180/79.1 |
| 3,693,081 | 9/1972 | Aviander | 324/78 Q |
| 3,870,952 | 3/1975 | Sibley | 246/28 F |
| 4,117,463 | 9/1978 | Norton | 340/652 |

FOREIGN PATENT DOCUMENTS

| | | | |
|---|---|---|---|
| 0266055 | 3/1970 | U.S.S.R. | 324/522 |
| 0650869 | 3/1979 | U.S.S.R. | 246/34 C |

*Primary Examiner*—Herbert Goldstein
*Assistant Examiner*—Jill Jackson
*Attorney, Agent, or Firm*—Robert M. Sigler

[57] ABSTRACT

To detect a short circuit condition between guide paths embedded in the floor for automatic guided vehicles, a detection relay has a pair of current transformers having primary windings connected into a guide path circuit at points on the source and the return side of the circuit, the transformer secondary windings being connected in opposition to yield a null signal when there is no short and a finite signal when primary current inequalities are present. Amplifier circuitry discriminates between null and finite signals and controls a relay which activates an annunciator.

5 Claims, 2 Drawing Sheets

GUIDE PATH SHORT DETECTOR

BACKGROUND OF THE INVENTION

This invention relates to a short detector and particularly to such a detector which detects shorts between adjacent guide paths. The desire for factory automation has encouraged the widespread use of automatic guided vehicles (AGVs) with self contained motive control systems which travel unattended through aisles in a factory for material delivery. Often the guidance control consists of signal bearing wires buried in the floor along the desired AGV path. A slot or groove in the floor containing the wires is filled with grout to protect the wire. Each wire or guide path carries current at a specified frequency and each AGV has receivers attuned to a given frequency for delivering position signals to its motive control system. The AGV then follows the route of a guide path having the frequency which matches the given frequency of the AGV. If more than one AGV travels the same aisle, two or more routes may coincide. It is then desirable to lay the wires in the same slot. Each wire carries a different frequency so that each AGV can follow its respective guide path and ignore the others.

Experience with such systems has shown that from time to time a sharp piece of metal such as a screw may fall on the floor, become embedded in the grout and contact the guide path wiring. Where two adjacent wires are contacted by the metal intrusion, the wires are shorted and the signal from one guide path can enter another guide path. In that case, a current of a certain frequency may divide and follow two paths so that guide path integrity is lost. An AGV attuned to that frequency may follow the wrong path, stop, or exhibit some erratic behavior. This AGV behavior does not necessarily happen as soon as the short occurs, and in fact such behavior will not occur until the vehicle enters a portion of its route which is affected by the short, so that there will be a time delay between the shorting event and any noticeable problem. In any case, the plant operation is eventually interrupted; and since the AGVs are unattended, some additional time may elapse before the condition is noticed. Then maintenance personnel must analyze any unusual events to determine a cause. Once it is known that the path is shorted they must locate and repair the fault. The repair must be made as soon as possible to prevent or minimize production down time. Thus it is important to be made aware of a short as soon as possible. It is also important to know which of several wires are involved in the short condition.

The AGV systems often are equipped with instruments to detect open circuits in the guide paths. However detectors for short conditions were not available prior to this invention.

SUMMARY OF THE INVENTION

It is therefore an object of the invention to provide apparatus for detecting shorts in AGV guide paths. It is another object of the invention to provide apparatus for identifying specific guide paths that are shorted.

The invention is carried out in a guide path system having adjacent guide paths with means for detecting a short condition between guide paths comprising: current sensing means in spaced locations along one guide path to generate signals which are proportional to the currents, means coupled to the current sensing means for comparing the signals and producing an output when a current signal difference is caused by a short condition between the locations, and means coupled to the amplifier output for responding to a short condition.

The above and other advantages of the invention will become more apparent from the following description taken in conjunction with the accompanying drawings wherein like references refer to like parts.

DESCRIPTION OF THE PREFERRED EMBODIMENT

Figure 1:
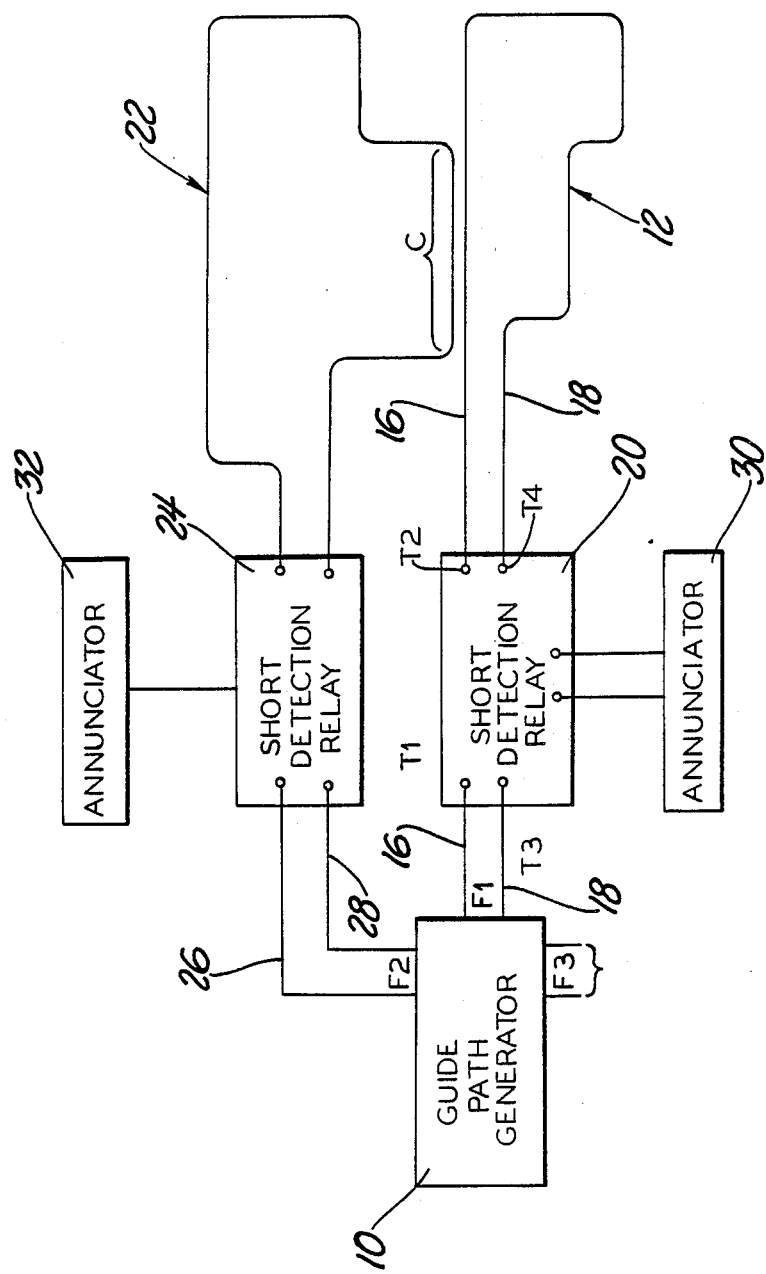
FIG. 1 is a schematic diagram of a guide path system incorporating a short detector according to the invention.

The system in which a short detector is useful is shown schematically in FIG. 1. A guide path generator 10 produces a different frequency for each path. Such generators are well known. The frequencies F1, F2 and F3 may be 2575 Hz, 3433 Hz and 4390 Hz, for example. The current supplied to each path is typically 0.5 to 1 amp.

A first path 12 traces a closed circuit along the desired route and is connected by a source line 16 and a return line 18 to the generator 10 which supplies current at a frequency F1 to the path. A short detection relay 20 is connected at or near the generator 10 and has terminals T1 and T2 connected serially in the source line 16 and terminals T3 and T4 in the return line 18. A second path 22 is similar to the path 12 and the two paths have a common route C over a portion of their range. The path 22 is connected by source and return lines 26 and 28 to the generator to receive current at a second frequency F2 and another short detection relay 24 is coupled into the lines 26 and 28. Each short detection relay 20, 24 is connected to an annunciator 30, 32 respectively for giving a warning or indication when a short is detected.

While it is usually most convenient to couple the detector relays to the paths at the generator, it is also effective to place them elsewhere in the path so long as the terminals T2 and T4 are connected to spaced points along the wire to embrace the common route C where a short can occur.

The short detection relay relies on the presence of current in one path which originated in another path. Thus by comparing the currents at two spaced locations in a path it is possible to detect any extraneous current which leaked in from another path at a point between the two spaced locations. For the system where each path has a different frequency a small amount of leakage can be detected.

Figure 2:
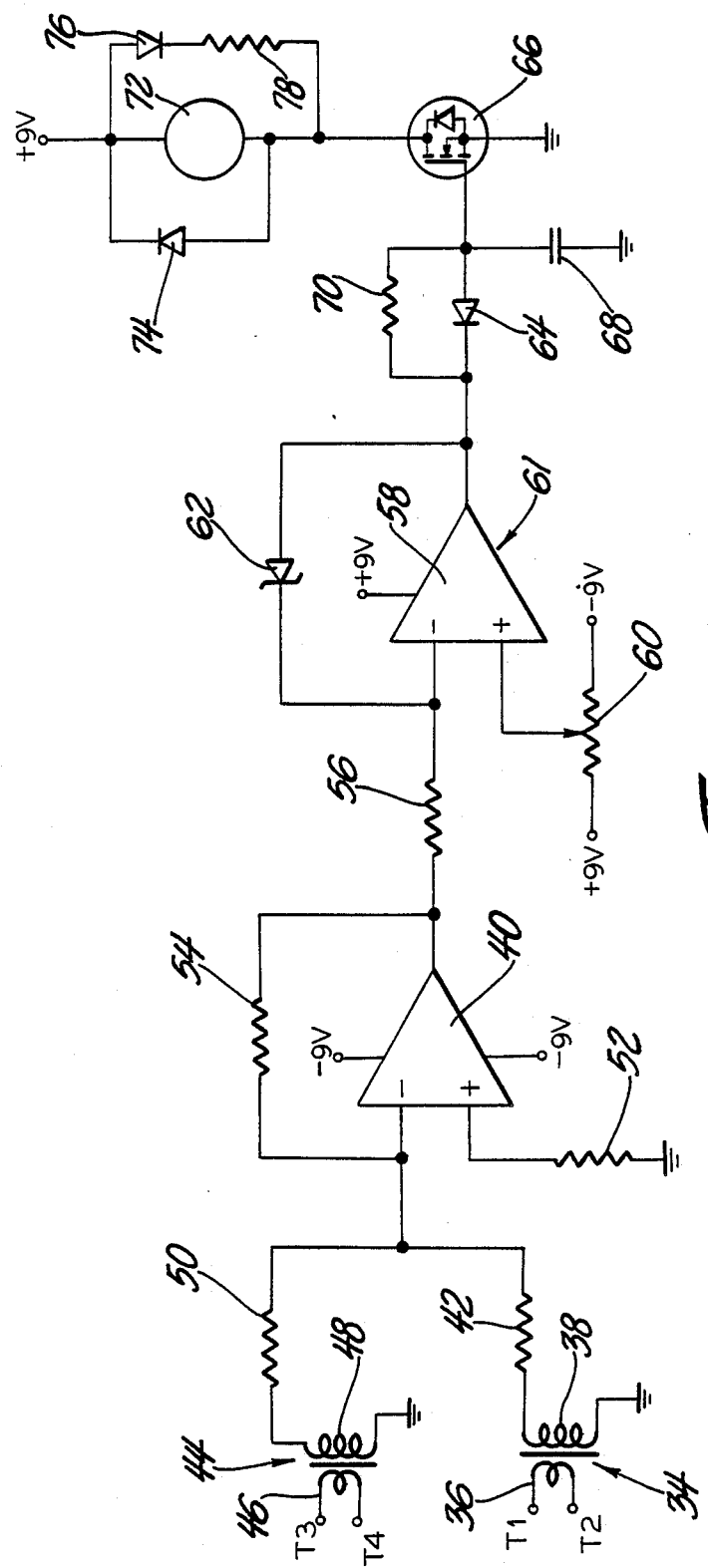
FIG. 2 is a schematic circuit diagram of a short detector according to the invention.

Details of the short detection relay 20 are shown in FIG. 2. A first transformer 34 has a primary winding 36 connected across terminals T1 and T2 and a secondary winding 38 grounded at one end and connected at the other end to an input of an operational amplifier 40 via a resistor 42. A second transformer 44, identical to the first transformer, has a primary winding 46 connected across terminals T3 and T4 and a secondary winding 48 grounded at one end and connected at the other end to the input of the operational amplifier 40 via a resistor 50. The resistors 42 and 50 have nominally equal value (56 K). It is important that the transformer secondary windings 38, 48 be connected to the amplifier 40 in 180 degree phase opposition so that equal currents will cancel out to produce a null input to the amplifier so long as the same current flows in the two primary windings 36, 46. In the event of transformer inequalities, one of the resistors 42 or 50 can be adjusted to compensate for any resulting offset to assure the null input.

The amplifier 40 has a second input coupled through a resistor 52 (18 K) to ground to establish a reference voltage to bias the amplifier off at very low signal voltages. A feedback resistor 54 (1 M) couples the output and the first input terminal. The amplifier 40 output is fed through a resistor 56 (18 K) to a first input of another operational amplifier 58 which has a second input connected to an adjustable tap of a potentiometer 60. The operational amplifier 58 and its attendant circuitry comprise a modified zero crossing detector 61. The potentiometer biases the amplifier 58 on to provide a positive output for low voltage signals on the first input. Adjustment of the potentiometer will adjust the sensitivity of the detector. A zener diode 62 forms the feedback path for the amplifier 58 and is poled to make the output go to +0.7 volts whenever the input is zero or less and −4.9 volts whenever the input is greater than zero.

A rectifier and filter comprise a diode 64 with its cathode connected to the amplifier 58 output and its anode connected to the gate of an FET 66 and to ground through a capacitor 68 (0.33 uF). A resistor 70 (150 K) across the diode passes a positive voltage to the gate at steady state conditions to hold the FET on. A relay 72 in series with the FET 66 is energized when the FET is on. A diode 74 across the relay 72 bypasses inductive spikes when the relay is turned off. An LED 76 in series with a resistor 78 (540) is connected across the relay to give a visual signal when the FET is energized.

In operation, the relay 72 is arranged to activate an annunciator when the relay turns off. Thus when there is no short the relay 72 and the FET 66 are turned on and when a short is detected they are turned off so that the annunciator issues a signal. During normal operation of the guide paths the transformers will have equal input currents and equal output voltages. The output voltages are in opposite phase and cancel out so that the net transformer output will be substantially zero. The zero net output effects a ground or zero voltage at the output of the amplifier 40 which, in turn, causes the zero crossing detector 61 to have a positive steady state output voltage which is applied through the resistor 70 to the FET to thereby turn on the FET and the relay 72.

In the event of a short either of two conditions may occur: (1) the single frequency signal of a guide path becomes weaker at the return line, or (2) a second frequency appears on the return line. In either case the normal single frequency signal on the source line does not balance out the signal on the return line. The signal difference will appear in the net transformer output which is applied to the first amplifier 40 making its input and output alternate between positive and negative values. This causes the zero crossing detector 61 to oscillate between +0.7 and −4.9 volts. The diode 64 readily discharges the capacitor 68 to a negative voltage which turns off the FET 66 and the relay 72, thus activating the annunciator. The filtering action of the capacitor holds a negative voltage on the FET gate as long as the oscillation continues.

It will thus be seen that the short detector provides immediate indication of a short between guide paths embedded in the same slot. Tests of the device show that a current imbalance of 6% or 7% is detected and it is effective when the short is from the source side to a return side of a path, from source side to source side, or even return to return sides when the returns are connected to a common ground. Thus the detector is sensitive to very small amounts of current imbalance so that even if a short has high impedance it may be detected and corrected before it becomes a problem to the AGV. When each guide path has a short detector the information from each shorted path reveals which paths are shorted; this information along with a map of the guide path routes narrows down the location of the short.

The embodiments of the invention in which an exclusive property or privilege is claimed are defined as follows:

1. In a guide path system having adjacent guide paths, apparatus for detecting a short condition of the guide paths comprising:
    means for generating different energizing currents in each of the guide paths,
    means for sensing currents at spaced locations along one of the guide paths and generating signals proportional thereto, and
    means coupled to the current sensing means for comparing the signals and producing an output when a difference exists between the signals, the existence of the output indicating the short condition of the guide paths between the spaced locations.

2. The short detection apparatus of claim 1 in which the different energizing currents differe in frequency.

3. In a guide path system having adjacent guide paths provided with different energizing currents, apparatus for detecting a short condition of the guide paths comprising:
    two current transformers with primary and secondary windings having their respective primary windings connected at opposite ends of one of the guide paths for energization by guide paths currents at the respective ends of the one of the guide paths to produce secondary signals which are equal when the guide path currents are equal and are different when the guide path currents are unequal,
    means for coupling the transformer secondary signals in counter phase to produce a null when the secondary signals are equal and a finite voltage when the secondary signals are not equal, and
    amplifier means connected to the coupling means for detecting the finite voltage and producing an output when the finite voltage exceeds a threshold, and
    relay means coupled to the amplifier for responding to he output thereof to indicate the short condition of the guide paths.

4. The invention as defined in claim 3 wherein the finite voltage is an alternating voltage and wherein the amplifier means includes a zero crossing detector for issuing an oscillating signal when the finite voltage is detected, and
    a diode for rectifying the oscillating signal and coupling the rectified signal the relay means for effecting the response thereof when the oscillating signal is detected.

5. The invention as defined in claim 3 wherein the finite voltage is an alternating voltage and wherein the amplifier means includes a zero crossing detector for issuing an oscillating signal when the finite voltage is detected and a DC signal when the finite voltage is note detected, a diode for rectifying the oscillating signal and coupling the rectified signal to the relay means for effecting the response thereof when the oscillating signal is detected, and a resistor in parallel with the diode for passing the DC signal to the relay means, the DC signal having a polarity effective to prevent the response of the relay means in the absence of the oscillating signal.

* * * * *